(12) United States Patent
Goto et al.

(10) Patent No.: US 10,398,026 B2
(45) Date of Patent: Aug. 27, 2019

(54) LAMINATED SUBSTRATE AND METHOD OF MANUFACTURING LAMINATED SUBSTRATE

(71) Applicants: TOYOTA JIDOSHA KABUSHIKI KAISHA, Toyota-shi, Aichi-ken (JP); Hitachi Chemical Company, Ltd., Chiyoda-ku, Tokyo (JP)

(72) Inventors: Akihito Goto, Nagoya (JP); Masahiro Sakata, Nisshin (JP); Masaki Yamaguchi, Tsukuba (JP)

(73) Assignees: TOYOTA JIDOSHA KABUSHIKI KAISHA, Toyota-shi, Aichi-ken (JP); Hitachi Chemical Company, Ltd., Chiyoda-ku, Tokyo (JP)

( * ) Notice: Subject to any disclaimer, the term of this patent is extended or adjusted under 35 U.S.C. 154(b) by 0 days.

(21) Appl. No.: 16/130,485

(22) Filed: Sep. 13, 2018

(65) Prior Publication Data
US 2019/0104611 A1    Apr. 4, 2019

(30) Foreign Application Priority Data
Oct. 4, 2017   (JP) .................................. 2017-194304

(51) Int. Cl.
*H05K 1/02*   (2006.01)
*H05K 3/40*   (2006.01)
(Continued)

(52) U.S. Cl.
CPC ........... *H05K 1/0298* (2013.01); *H05K 1/095* (2013.01); *H05K 1/115* (2013.01); *H05K 3/4069* (2013.01);
(Continued)

(58) Field of Classification Search
CPC combination set(s) only.
See application file for complete search history.

(56) References Cited

U.S. PATENT DOCUMENTS 5,022,960 A * 6/1991 Takeyama ........... H01L 21/4803
216/13
5,073,814 A * 12/1991 Cole, Jr. ............. H01L 23/5222
257/643

(Continued)

FOREIGN PATENT DOCUMENTS

JP    06-342977 A    12/1994
JP    2001-160687 A    6/2001
(Continued)

*Primary Examiner* — William H. Mayo, III
*Assistant Examiner* — Krystal Robinson
(74) *Attorney, Agent, or Firm* — Sughrue Mion, PLLC (57) ABSTRACT

A laminated substrate includes: a first substrate; a second substrate having a through-hole; a third substrate; a first adhesive layer bonding a rear surface of the first substrate and a front surface of the second substrate; a second adhesive layer bonding a rear surface of the second substrate and a front surface of the third substrate; a first post penetrating through the first adhesive layer, electrically connecting the first substrate to the second substrate, and made of an alloy of a high melting point metal and a low melting point metal; a second post penetrating through the second adhesive layer, electrically connecting the second substrate to the third substrate, and made of an alloy of the high melting point metal and the low melting point metal; and an electronic component fixed to the front surface of the third substrate and disposed in the through-hole of the second substrate.

2 Claims, 5 Drawing Sheets

(51) Int. Cl.
*H05K 3/46* (2006.01)
*H05K 1/11* (2006.01)
*H05K 1/09* (2006.01)

(52) U.S. Cl.
CPC ......... *H05K 3/4614* (2013.01); *H05K 3/4647* (2013.01); *H05K 3/4652* (2013.01)

(56) References Cited

U.S. PATENT DOCUMENTS

| | | | | |
|---|---|---|---|---|
| 5,305,519 | A * | 4/1994 | Yamamoto | H01L 23/5226 257/E23.145 |
| 5,562,971 | A * | 10/1996 | Tsuru | H01L 21/4857 174/255 |
| 5,600,103 | A | 2/1997 | Odaira et al. | |
| 6,518,501 | B1 * | 2/2003 | Kawahara | H01L 23/055 174/536 |
| 2002/0119396 | A1 | 8/2002 | Jiang et al. | |
| 2004/0124541 | A1 * | 7/2004 | Wu | H01L 23/49816 257/778 |
| 2008/0099911 | A1 * | 5/2008 | Machida | H01L 23/13 257/723 |
| 2009/0103005 | A1 * | 4/2009 | Nakazato | H01L 33/483 349/62 |
| 2009/0215231 | A1 * | 8/2009 | Inoue | H01L 24/82 438/125 |
| 2013/0008698 | A1 * | 1/2013 | Himori | H01B 1/22 174/251 |
| 2015/0024552 | A1 * | 1/2015 | Su | H01L 24/83 438/118 |

FOREIGN PATENT DOCUMENTS

| | | |
|---|---|---|
| JP | 2012-248897 A | 12/2012 |
| JP | 2018-063983 A | 4/2018 |

* cited by examiner

LAMINATED SUBSTRATE AND METHOD OF MANUFACTURING LAMINATED SUBSTRATE

INCORPORATION BY REFERENCE

The disclosure of Japanese Patent Application No. 2017-194304 filed on Oct. 4, 2017 including the specification, drawings and abstract is incorporated herein by reference in its entirety.

BACKGROUND

1. Technical Field

The disclosure relates to a laminated substrate and a method of manufacturing a laminated substrate.

2. Description of Related Art

Japanese Unexamined Patent Application Publication No. 2012-248897 (JP 2012-248897 A) discloses a laminated substrate. The laminated substrate includes a structure having a plurality of substrates laminated. Electronic components are embedded in the laminated substrate. The substrates (more specifically, wires of the substrates) in the laminated substrate are electrically connected to each other by an interlayer connector (hereinafter, referred to as a post in the disclosure).

Japanese Unexamined Patent Application Publication No. 6-342977 (JP 6-342977 A) discloses a technique for forming a post of a conductive paste. In the technique, a bump is formed of the conductive paste on the surface of a substrate before being laminated. A plurality of substrates is laminated in a state in which adhesive sheets are interposed between the substrates. Here, the bump is pressed against the adhesive sheet such that the bump penetrates through the adhesive sheet. The laminated substrates are heated while being pressed such that the substrates are bonded to each other. In the manner described above, a laminated substrate is formed. The bump penetrates through the adhesive sheet. Therefore, the bump becomes a post that electrically connects the substrates on both sides of the adhesive sheet. With the method described above, the laminated substrate can be manufactured at low costs.

SUMMARY

In the method of JP 6-342977 A, when the laminated substrates are heated while being pressed, the adhesive sheets soften and flow. Therefore, the conductive paste is caused to flow by the flowing adhesive sheets, and there may be cases where the post is formed obliquely or the position of the post may be shifted. For this reason, there may be cases where the post is not suitably connected to wires, resulting in a conduction failure. Therefore, the disclosure provides a method of more suitably manufacturing a laminated substrate having an electronic component embedded therein.

A first aspect of the disclosure relates to a laminated substrate. The laminated substrate includes: a first substrate; a second substrate having a through-hole; a third substrate; a first adhesive layer which bonds a rear surface of the first substrate and a front surface of the second substrate; a second adhesive layer which bonds a rear surface of the second substrate and a front surface of the third substrate; a first post which penetrates through the first adhesive layer, electrically connects the first substrate to the second substrate, and is made of an alloy of a high melting point metal (for example, Cu (copper)) and a low melting point metal (for example, a Sn—Bi alloy); a second post which penetrates through the second adhesive layer, electrically connects the second substrate to the third substrate, and is made of an alloy of the high melting point metal and the low melting point metal; and an electronic component which is fixed to the front surface of the third substrate and is disposed in the through-hole of the second substrate.

The laminated substrate can be manufactured as follows. A first adhesive sheet (a sheet to be the first adhesive layer) having a first through-hole, a second adhesive sheet (a sheet to be the second adhesive layer) having a second through-hole and a third through-hole, and the second substrate having a fourth through-hole are prepared. The following steps are performed on the first substrate, the second substrate, and the third substrate before being bonded together. A first post is formed by applying a conductive paste, in which the high melting point metal and the low melting point metal are mixed, to the rear surface of the first substrate or the front surface of the second substrate and heating the applied conductive paste to enter a semi-sintered state. A second post is formed by applying the conductive paste, in which the high melting point metal and the low melting point metal are mixed, to the rear surface of the second substrate or the front surface of the third substrate and heating the applied conductive paste to enter a semi-sintered state. In this specification, the semi-sintered state means a state in which at least a portion of the low melting point metal remains unalloyed and a plurality of particles of the high melting point metal is connected by the low melting point metal. The electronic component is fixed to the front surface of the third substrate. After performing the above-described steps, the first substrate, the second substrate, and the third substrate are bonded together by laminating the first substrate, the second substrate, and the third substrate in a state in which the first adhesive sheet is disposed between the rear surface of the first substrate and the front surface of the second substrate and the second adhesive sheet is disposed between the rear surface of the second substrate and the front surface of the third substrate, and pressing and heating the first substrate, the second substrate, and the third substrate in a lamination direction. In the manner described above, the laminated substrate is obtained. During the bonding, the first post is disposed in the first through-hole to electrically connect the first substrate to the second substrate by the first post. The second post is disposed in the second through-hole to electrically connect the second substrate to the third substrate by the second post. The electronic component is disposed in the third through-hole and the fourth through-hole such that the electronic component is embedded in the laminated substrate. In the step described above, heat is applied to the first adhesive sheet and the second adhesive sheet. Each of the adhesive sheets softens and flows by being pressed in a heated state. On the other hand, in the first post and the second post in the semi-sintered state, the particles of the high melting point metal are confined by the low melting point metal. Therefore, the first post and the second post have relatively high strength. Accordingly, even if the adhesive sheet flows, the first post and the second post are less likely to flow. Therefore, it is possible to suppress conduction failure of each of the posts due to the flowing adhesive sheet. As described above, with the structure of the laminated substrate, the laminated substrate can be manufactured while suppressing conduction failure of each of the posts.

The disclosure provides a method of manufacturing a laminated substrate. A second aspect of the disclosure relates to a method of manufacturing a laminated substrate. The method includes: preparing a first adhesive sheet having a first through-hole; preparing a second adhesive sheet having a second through-hole and a third through-hole; preparing a second substrate having a fourth through-hole; forming a first post by applying a conductive paste, in which a high melting point metal and a low melting point metal are mixed, to a rear surface of a first substrate or a front surface of the second substrate and heating the applied conductive paste to enter a semi-sintered state; forming a second post by applying the conductive paste, in which the high melting point metal and the low melting point metal are mixed, to a rear surface of the second substrate or a front surface of a third substrate and heating the applied conductive paste to enter a semi-sintered state; fixing an electronic component to the front surface of the third substrate; and after the fixing of the electronic component to the front surface of the third substrate, bonding the first substrate, the second substrate, and the third substrate by laminating the first substrate, the second substrate, and the third substrate in a state in which the first adhesive sheet is disposed between the rear surface of the first substrate and the front surface of the second substrate and the second adhesive sheet is disposed between the rear surface of the second substrate and the front surface of the third substrate, and pressing and heating the first substrate, the second substrate, and the third substrate in a lamination direction. During the bonding, the first post is disposed in the first through-hole to electrically connect the first substrate to the second substrate by the first post, the second post is disposed in the second through-hole to electrically connect the second substrate to the third substrate by the second post, and the electronic component is disposed in the third through-hole and the fourth through-hole.

A first adhesive sheet preparing step, a second adhesive sheet preparing step, a second substrate preparing step, a first post forming step, a second post forming step, and an electronic component connecting step may be performed in any order. When the first adhesive sheet is prepared, the first through-hole may be formed in the first adhesive sheet, or the first adhesive sheet having the first through-hole may be procured. When the second adhesive sheet is prepared, the second through-hole and the third through-hole may be formed in the second adhesive sheet, or the second adhesive sheet having the second through-hole and the third through-hole may be procured. When the second substrate is prepared, the fourth through-hole may be formed in the second substrate, or the second substrate having the fourth through-hole may be procured.

With the manufacturing method, even if the adhesive sheet flows, the first post and the second post in the semi-sintered state are less likely to flow. Therefore, it is possible to suppress conduction failure of each of the posts due to the flowing adhesive sheet. With the manufacturing method, the laminated substrate can be manufactured while suppressing conduction failure of each of the posts.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
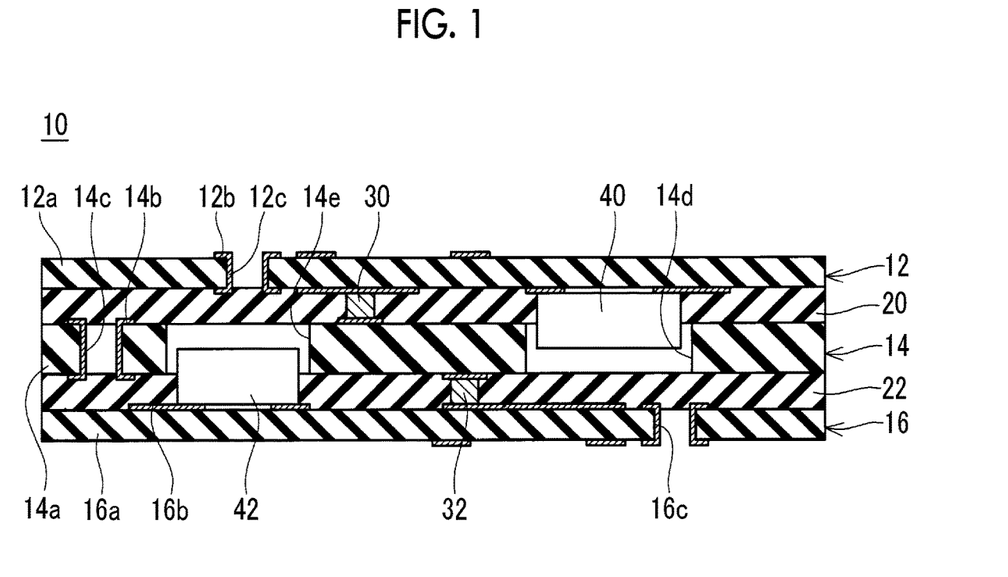
FIG. 1 is a sectional view of a laminated substrate.

FIG. 1 shows a sectional view of a laminated substrate 10 of an embodiment. The laminated substrate 10 has a structure in which an upper substrate 12, an intermediate substrate 14, and a lower substrate 16 are laminated. Each of the upper substrate 12, the intermediate substrate 14, and the lower substrate 16 is a printed wiring board. The upper substrate 12 includes a substrate body 12a made of an insulator, and a wire 12b provided on the upper surface and the lower surface of the substrate body 12a. The wire 12b is made of copper. The wire 12b on the upper surface of the upper substrate 12 and the wire 12b on the lower surface thereof are connected by a through-hole 12c or the like. The intermediate substrate 14 includes a substrate body 14a made of an insulator, and a wire 14b provided on the upper surface and the lower surface of the substrate body 14a. The wire 14b is made of copper. The wire 14b on the upper surface of the intermediate substrate 14 and the wire 14b on the lower surface thereof are connected by a through-hole 14c or the like. The lower substrate 16 includes a substrate body 16a made of an insulator, and a wire 16b provided on the upper surface and the lower surface of the substrate body 16a. The wire 16b is made of copper. The wire 16b on the upper surface of the lower substrate 16 and the wire 16b on the lower surface thereof are connected by a through-hole 16c or the like. A prepreg 20 is disposed between the lower surface of the upper substrate 12 and the upper surface of the intermediate substrate 14. The prepreg 20 bonds the lower surface of the upper substrate 12 and the upper surface of the intermediate substrate 14. The prepreg 20 is made of an insulator. A prepreg 22 is disposed between the lower surface of the intermediate substrate 14 and the upper surface of the lower substrate 16. The prepreg 22 bonds the lower surface of the intermediate substrate 14 and the upper surface of the lower substrate 16. The prepreg 22 is made of an insulator. Since the prepregs 20, 22 bond the substrates 12, 14, 16, the substrates 12, 14, 16 are integrated to form the laminated substrate 10.

A post 30 is disposed between the upper substrate 12 and the intermediate substrate 14. The post 30 is made of a metal alloyed with a high melting point metal (in the embodiment, Cu (copper)) and a low melting point metal (in the embodiment, a Sn—Bi alloy (an alloy of tin and bismuth)). The post 30 penetrates through the prepreg 20 from the upper surface to the lower surface thereof and is in contact with the upper substrate 12 and the intermediate substrate 14. The post 30 connects the wire 12b on the lower surface of the upper substrate 12 to the wire 14b on the upper surface of the intermediate substrate 14.

A post 32 is disposed between the intermediate substrate 14 and the lower substrate 16. Like the post 30, the post 32 is made of a metal alloyed with a high melting point metal (Cu) and a low melting point metal (Sn—Bi alloy). The post 32 penetrates through the prepreg 22 from the upper surface to the lower surface thereof and is in contact with the intermediate substrate 14 and the lower substrate 16. The post 32 connects the wire 14b on the lower surface of the intermediate substrate 14 to the wire 16b on the upper surface of the lower substrate 16.

An electronic component 40 is fixed to the lower surface of the upper substrate 12. The electronic component 40 is connected to the wire 12b of the lower surface of the upper substrate 12 by a solder or a conductive bonding material (not illustrated). The intermediate substrate 14 has a through-hole 14d which passes through the intermediate substrate 14 from the upper surface to the lower surface thereof. The electronic component 40 penetrates through the prepreg 20 and is inserted into the through-hole 14d. That is, a portion of the electronic component 40 (the lower end portion in FIG. 1) is disposed in the through-hole 14d.

An electronic component 42 is fixed to the upper surface of the lower substrate 16. The electronic component 42 is connected to the wire 16b of the upper surface of the lower substrate 16 by a solder or a conductive bonding material (not illustrated). The intermediate substrate 14 has a through-hole 14e which passes through the intermediate substrate 14 from the upper surface to the lower surface thereof. The electronic component 42 penetrates through the prepreg 22 and is inserted into the through-hole 14e. That is, a portion of the electronic component 42 (the upper end portion in FIG. 1) is disposed in the through-hole 14e.

For example, the electronic components 40, 42 are capacitors, resistors, or diodes. For example, the electronic components 40, 42 are package products such as quad flat packages (QFP), thin small outline packages (TSOP), small outline packages (SOP), chip size packages (CSP), and ball grid arrays (BGA).

Figure 2:
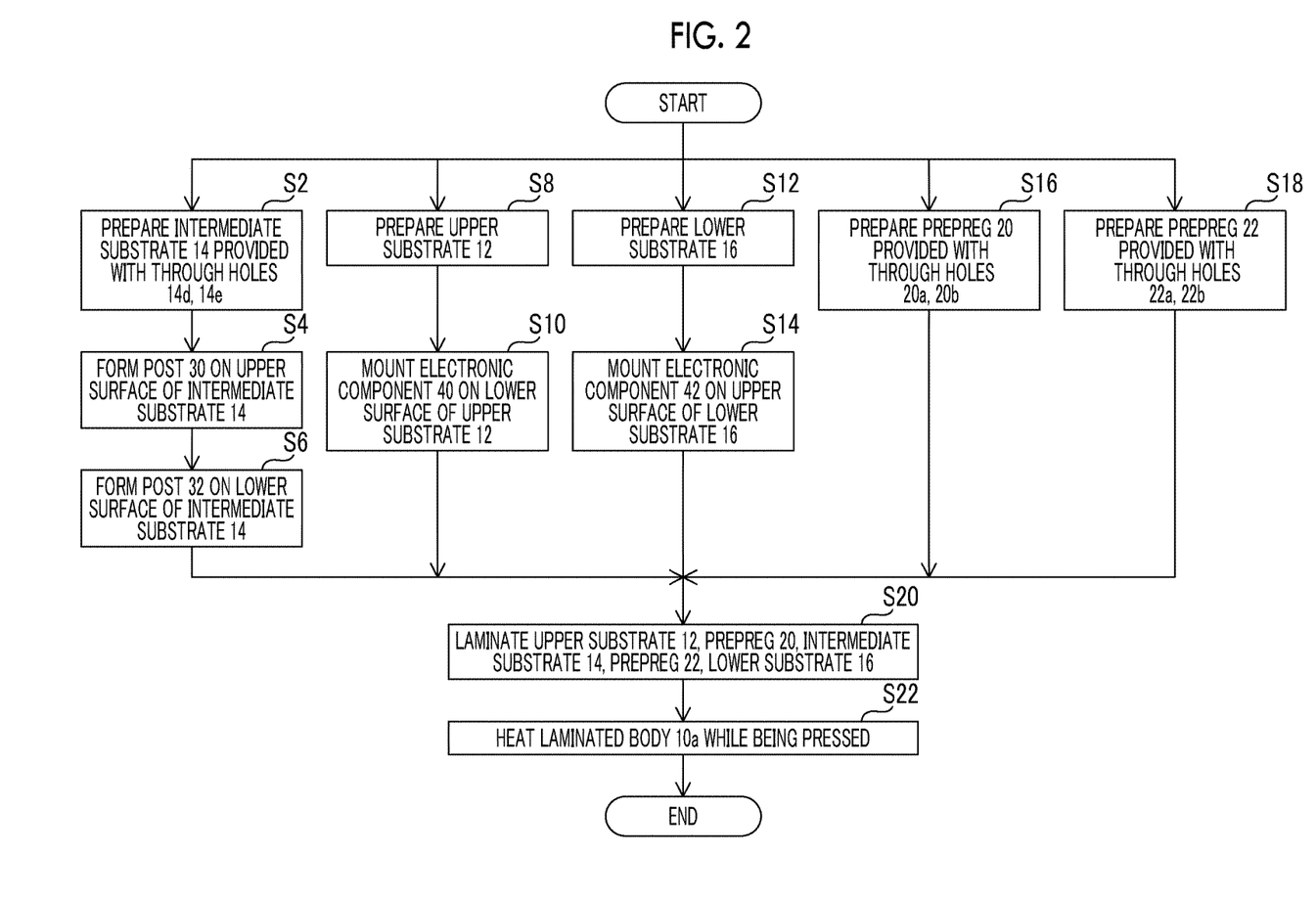
FIG. 2 is a flowchart showing a method of manufacturing the laminated substrate.

A method of manufacturing the laminated substrate 10 will be described. FIG. 2 illustrates the method of manufacturing the laminated substrate 10. As shown in FIG. 2, in a manufacturing process of the laminated substrate 10, steps for the intermediate substrate 14 (steps S2 to S6), steps for the upper substrate 12 (steps S8 to S10), steps for the lower substrate 16 (steps S12 to S14), a step for the prepreg 20 (step S16), and a step for the prepreg 22 (step S18) are separately performed. Thereafter, steps of laminating and bonding the members (steps S20 to S22) are performed.

In step S2, the intermediate substrate 14 is prepared. The intermediate substrate 14 is produced in the same process as the manufacturing process of a general printed wiring board. That is, the wire 14b is provided on the upper surface and the lower surface of the substrate body 14a in a desired pattern. In addition, the through-holes 14d, 14e are formed in the substrate body 14a. In step S2, the intermediate substrate 14 may be externally procured, or the intermediate substrate 14 may be produced. In the figure, the intermediate substrate 14 is a two-layer plate (a substrate having wires in two layers), but the intermediate substrate 14 may be a multilayer plate.

In step S4, the post 30 is formed on the upper surface of the intermediate substrate 14. In step S4, three treatments of printing the post 30, drying the post 30, and heating the post 30 are performed.

Figure 3:
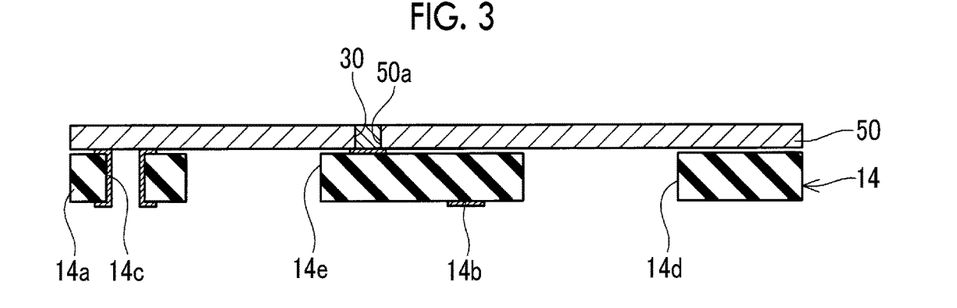
FIG. 3 is an explanatory view of steps of forming a post.

Printing the post 30 is performed. Here, as illustrated in FIG. 3, a metal mask 50 is provided on the upper surface of the intermediate substrate 14. The metal mask 50 has an opening 50a. The opening 50a is disposed on the wire 14b at a position where the post 30 is to be formed. The post 30 is formed by filling the opening 50a of the metal mask 50 with a conductive paste. The conductive paste is a paste in which particles of a high melting point metal (in the embodiment, Cu) and particles of a low melting point metal (in the embodiment, a Sn—Bi alloy) are dispersed in a binder resin. The melting point of the high melting point metal is higher than the melting point of the low melting point metal. In the embodiment, the melting point of the high melting point metal (Cu) is 1085° C., and the melting point of the low melting point metal (Sn—Bi alloy) is 139° C. When the opening 50a is filled with the conductive paste, the metal mask 50 is detached from the intermediate substrate 14.

Figure 4:
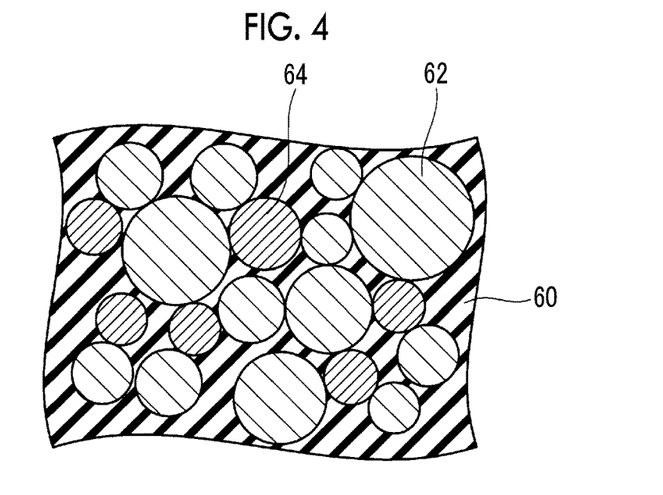
FIG. 4 is a view illustrating the internal structure of a post before being heated.

Drying the post 30 is performed. Here, by drying the post 30, a solvent contained in the binder resin in the conductive paste is vaporized. FIG. 4 illustrates the internal structure of the post 30 in a stage in which drying the post 30 is completed. As illustrated in FIG. 4, high melting point metal particles 62 and low melting point metal particles 64 are present in a dispersed state in a binder resin 60 which is dried. In the state, the high melting point metal particles 62 and the low melting point metal particles 64 are held by the binder resin 60. Therefore, the mechanical strength of the post 30 is relatively low. The particle size of the high melting point metal particles 62 is, for example, 5 to 15 μm, and the particle size of the low melting point metal particles 64 is, for example, 10 to 40 μm.

Figure 5:
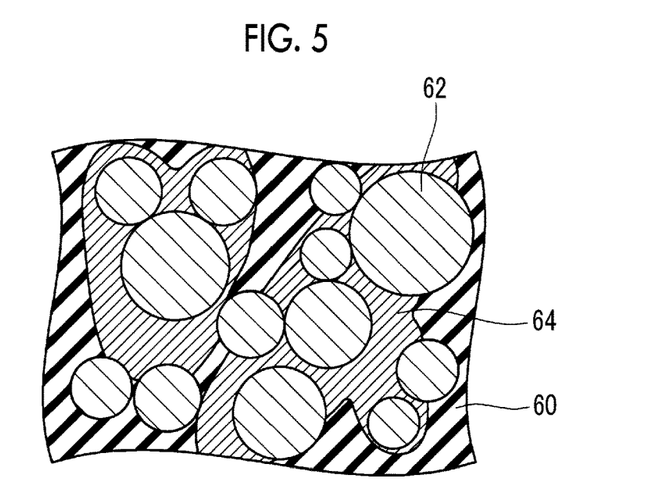
FIG. 5 is a view illustrating the internal structure of the post in a semi-sintered state.

Heating the post 30 is performed. Here, the intermediate substrate 14 having the post 30 formed thereon is subjected to a heat treatment at a temperature higher than the melting point of the low melting point metal and lower than the melting point of the high melting point metal, thereby bringing the post 30 into a semi-sintered state. Here, for example, a heating temperature can be set to 140° C. to 180° C., and a heating time can be set to 30 seconds to 10 minutes. FIG. 5 illustrates the internal structure of the post 30 after the heating treatment. As illustrated in FIG. 5, even after the heating treatment, most of the low melting point metal 64 (low melting point metal forming the low melting point metal particles 64 (see FIG. 4)) remains unalloyed. In addition, since the low melting point metal particles 64 are melted by the heating treatment, the low melting point metal 64 is distributed around the high melting point metal particles 62 after the heating treatment. A large number of high melting point metal particles 62 is connected by the low melting point metal 64. Therefore, the mechanical strength of the post 30 in the semi-sintered state after the heating is higher than in the state before the heating treatment (that is, the state in which the particles 62, 64 are connected by the binder resin 60 as illustrated in FIG. 4).

Figure 6:
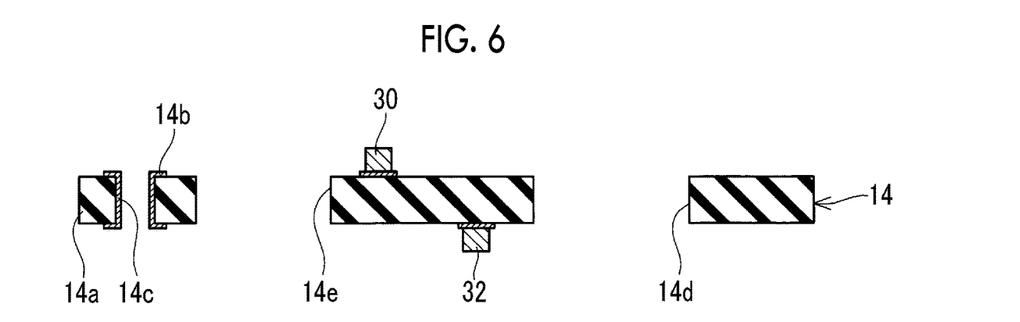
FIG. 6 is a sectional view of an intermediate substrate after forming the post.

In step S6, the post 32 is formed on the lower surface of the intermediate substrate 14. In step S6, as in step S4, the post 32 is formed. That is, the post 32 in the semi-sintered state is formed by the three treatments of printing the post 32, drying the post 32, and heating the post 32. By performing steps S4, S6, as illustrated in FIG. 6, the post 30 is provided on the wire 14b on the upper surface of the intermediate substrate 14, and the post 32 is provided on the wire 14b on the lower surface of the intermediate substrate 14.

In step S8, the upper substrate 12 is prepared. The upper substrate 12 is manufactured in the same process as the manufacturing process of a general printed wiring board. That is, the wire 12b is provided on the upper surface and the lower surface of the substrate body 12a in a desired pattern. In step S8, the upper substrate 12 may be externally procured, or the upper substrate 12 may be produced. In the figure, the upper substrate 12 is a two-layer plate (a substrate having wires in two layers), but the upper substrate 12 may be a multilayer plate.

Figure 7:
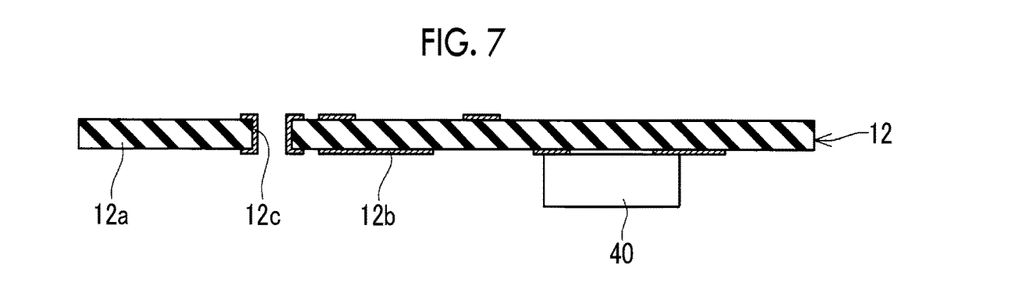
FIG. 7 is a sectional view of an upper substrate.

In step S10, as illustrated in FIG. 7, the electronic component 40 is mounted on the wire 12b on the lower surface of the upper substrate 12.

In step S12, the lower substrate 16 is prepared. The lower substrate 16 is manufactured in the same process as the manufacturing process of a general printed wiring board. That is, the wire 16b is provided on the upper surface and the lower surface of the substrate body 16a in a desired pattern. In step S12, the lower substrate 16 may be externally procured, or the lower substrate 16 may be produced. In the figure, the lower substrate 16 is a two-layer plate (a substrate having wires in two layers), but the lower substrate 16 may be a multilayer plate.

Figure 8:
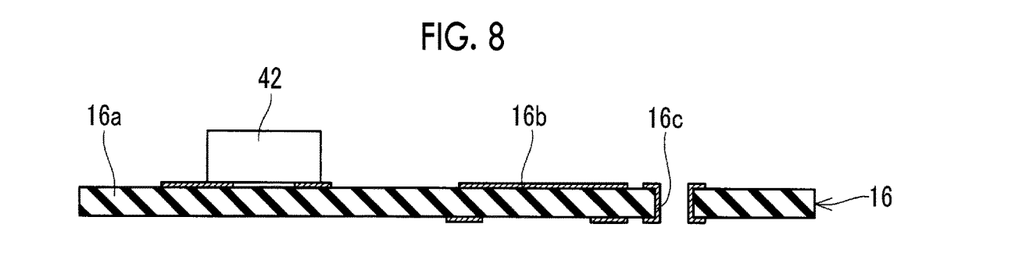
FIG. 8 is a sectional view of a lower substrate.

In step S14, as illustrated in FIG. 8, the electronic component 42 is mounted on the wire 16b on the upper surface of the lower substrate 16.

Figure 9:
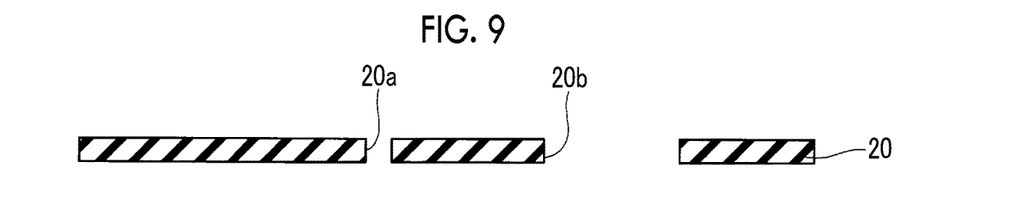
FIG. 9 is a sectional view of a prepreg.

In step S16, the prepreg 20 provided with the through-hole 20a and the through-hole 20b is prepared. As illustrated in FIG. 9, the through-holes 20a, 20b pass through the prepreg 20 from the upper surface to the lower surface thereof. The through-hole 20a is formed to have a size into which the post 30 can be inserted at a position corresponding to the post 30 (see FIG. 6). The through-hole 20b is formed to have a size into which the electronic component 40 can be inserted at a position corresponding to the electronic component 40 (see FIG. 7). In step S16, the through-holes 20a, 20b may be formed in the prepreg 20, or the prepreg 20 having the through-holes 20a, 20b formed therein may be externally procured.

Figure 10:
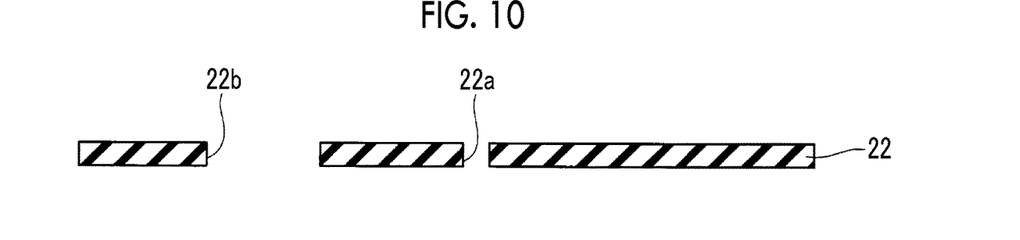
FIG. 10 is a sectional view of a prepreg.

In step S18, the prepreg 22 provided with the through-hole 22a and the through-hole 22b is prepared. As illustrated in FIG. 10, the through-holes 22a, 22b pass through the prepreg 22 from the upper surface of the lower surface thereof. The through-hole 22a is formed to have a size into which the post 32 can be inserted at a position corresponding to the post 32 (see FIG. 6). The through-hole 22b is formed to have a size into which the electronic component 42 can be inserted at a position corresponding to the electronic component 42 (see FIG. 8). In step S18, the through-holes 22a, 22b may be formed in the prepreg 22, or the prepreg 22 having the through-holes 22a, 22b formed therein may be externally procured.

Figure 11:
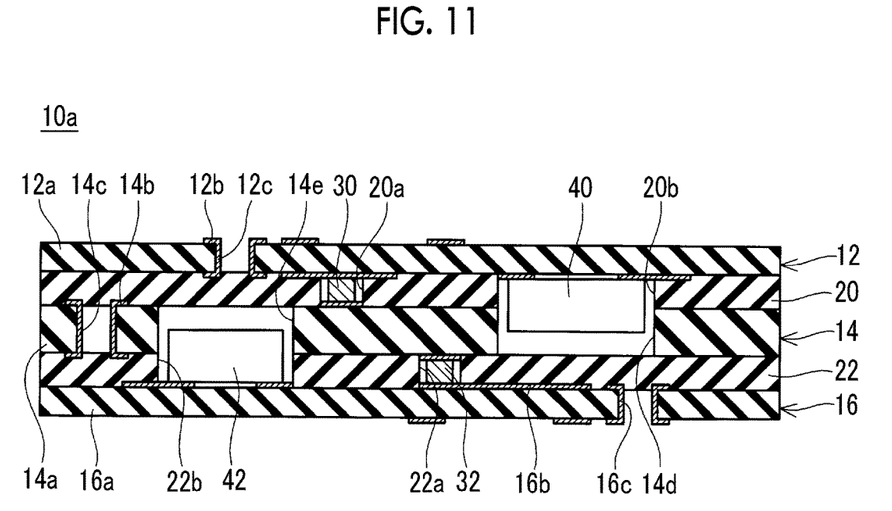
FIG. 11 is a sectional view of a laminated body.

After steps S2 to S18 are performed, in step S20, as illustrated in FIG. 11, the lower substrate 16, the prepreg 22, the intermediate substrate 14, the prepreg 20, and the upper substrate 12 are laminated in this order from below. When the prepreg 22 is placed on the lower substrate 16, the electronic component 42 is inserted into the through-hole 22b of the prepreg 22. When the intermediate substrate 14 is placed on the prepreg 22, the post 32 is inserted into the through-hole 22a of the prepreg 22, and the electronic component 42 is inserted into the through-hole 14e of the intermediate substrate 14. The post 32 comes into contact with the wire 16b on the upper surface of the lower substrate 16 in the through-hole 22a. When the prepreg 20 is placed on the intermediate substrate 14, the post 30 is inserted into the through-hole 20a of the prepreg 20. When the upper substrate 12 is placed on the prepreg 20, the electronic component 40 is inserted into the through-hole 20b of the prepreg 20 and the through-hole 14d of the intermediate substrate 14. The post 30 comes into contact with the wire 12b on the lower surface of the upper substrate 12.

In step S22, a laminated body 10a illustrated in FIG. 11 is heated while being pressed in the lamination direction. Step S22 may be performed in a vacuum atmosphere. In step S22, the laminated body is heated at a temperature higher than the heating temperature of the posts 30, 32 in steps S4, S6 and lower than the melting point of the high melting point metal. Here, for example, the heating temperature can be set to 160° C. to 200° C., and the heating time can be set to 5 minutes to 90 minutes. The pressing pressure can be set to, for example, 1 MPa to 4 MPa. The post 30 is heated in a state of being pressed against the wire 12b of the upper substrate 12. By the heating, the post 30 is sintered, and the post 30 is bonded to the wire 12b. The post 32 is heated in a state of being pressed against the wire 16b of the lower substrate 16. By the heating, the post 32 is sintered, and the post 32 is bonded to the wire 16b. By the heating, the prepregs 20, 22 are first softened and thereafter cured. Therefore, the cured prepreg 20 bonds the upper substrate 12 and the intermediate substrate 14, and the cured prepreg 22 bonds the intermediate substrate 14 and the lower substrate 16. Therefore, the upper substrate 12, the intermediate substrate 14, and the lower substrate 16 are bonded together via the prepregs 20, 22. As a result, the laminated substrate 10 illustrated in FIG. 1 is completed.

At the initial stage of step S22, the prepregs 20, 22 softened by the heating are pressed, whereby the prepregs 20, 22 flow in a direction along the substrates 12, 14, 16. In a case where the mechanical strength of the post 30 is weak, the post 30 is swept away by the flowing prepreg 20, and the position of the post 30 may be shifted or the post 30 may be formed obliquely. In the above case, the post 30 may not be connected to the wire 12b and may cause conduction failure. In a case where the mechanical strength of the post 32 is weak, the post 32 is swept away by the flowing prepreg 22, and the position of the post 32 may be shifted or the post 32 may be formed obliquely. In the above case, the post 32 may not be connected to the wire 16b and may cause conduction failure. However, in the embodiment, the posts 30, 32 before being sintered, are in the semi-sintered state (the state in which a large number of the high melting point metal particles 62 are connected together by the low melting point metal 64) illustrated in FIG. 5. Therefore, the posts 30, 32 have relatively high mechanical strength. Accordingly, it is possible to suppress that the posts 30, 32 flow, and it is possible to suppress conduction failure of the posts 30, 32.

Figure 12:
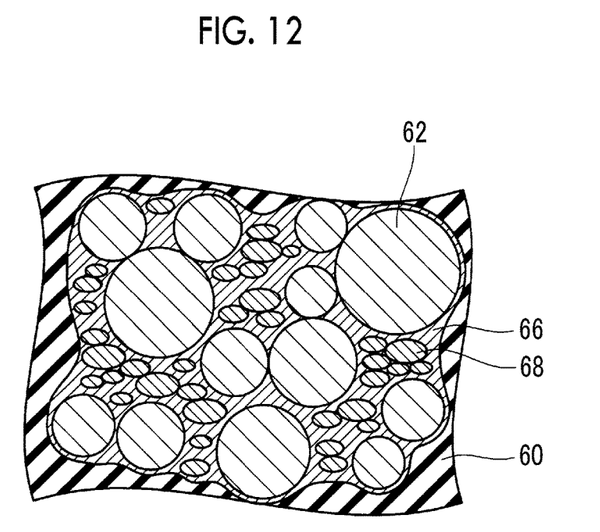
FIG. 12 is a view illustrating the internal structure of the post after being sintered.

In step S22, the low melting point metal 64 in the post 30 is melted by heating the post 30. The molten low melting point metal 64 is alloyed with the high melting point metal particles 62 (that is, Cu) and the adjacent wires 12b, 14b (that is, Cu). In the manner described above, the post 30 has a thermally more stable structure, and the post 30 is firmly connected to the wires 12b, 14b. FIG. 12 illustrates the internal structure of the post 30 after step S22 is performed. As illustrated in FIG. 12, the high melting point metal particles 62 and Bi particles 68 are dispersed in a Sn—Cu alloy 66. The Bi particles 68 made of Bi as a simple substance are dispersed and disposed around the high melting point metal particles 62. The Sn—Cu alloy 66 is an alloy formed by alloying Sn contained in the low melting point metal 64 (that is, the Sn—Bi alloy) illustrated in FIG. 5 with the high melting point metal particles 62 (that is, Cu). The Bi particles 68 are portions where bismuth contained in the low melting point metal 64 illustrated in FIG. 5 is precipitated as a simple substance. The melting point of the Sn—Cu alloy 66 ($Cu_6Sn_5$ or $Cu_3Sn$) is 415° C. or higher, and the melting point of the Bi particles 68 (Bi simple substance) is 271° C. The melting points of both the Sn—Cu alloy 66 and the Bi particles 68 are higher than the melting point (that is, 139° C.) of the low melting point metal 64 (the Sn—Bi alloy). As described above, the post 30 becomes thermally stable by sintering the post 30. In step S22, similarly to the post 30, the low melting point metal 64 of the post 32 is alloyed with the high melting point metal particles 62 and the adjacent wires 14*b*, 16*b*. That is, the internal structure of the post 32 becomes the structure illustrated in FIG. 12. In the manner described above, the post 32 becomes thermally stable, and the post 32 is firmly connected to the wires 14*b*, 16*b*.

By performing step S22, as illustrated in FIG. 1, the laminated substrate 10 having the electronic components 40, 42 embedded therein is completed. As described above, with the manufacturing method, since the posts 30, 32 can be formed using the conductive paste, the laminated substrate 10 can be manufactured at low costs. It is possible to suppress the posts 30, 32 flow in the pressing step. Therefore, it is possible to suppress that the posts 30, 32 fail in conduction to the wires 12*b*, 14*b*, 16*b*. Therefore, with the manufacturing method, the laminated substrate 10 can be manufactured with a higher yield.

In the embodiment described above, before the laminating step (step S20), the post 30 is formed on the wire 14*b* on the upper surface of the intermediate substrate 14, and in the pressing step (step S22), the post 30 is bonded to the wire 12*b* on the lower surface of the upper substrate 12. However, the post 30 may be formed on the wire 12*b* on the lower surface of the upper substrate 12 before the laminating step, and the post 30 may be bonded to the wire 14*b* on the upper surface of the intermediate substrate 14 in the pressing step.

In the embodiment described above, before the laminating step (step S20), the post 32 is formed on the wire 14*b* on the lower surface of the intermediate substrate 14, and in the pressing step (step S22), the post 32 is bonded to the wire 16*b* on the upper surface of the lower substrate 16. However, the post 32 may be formed on the wire 16*b* on the upper surface of the lower substrate 16 before the laminating step, and the post 32 may be bonded to the wire 14*b* on the lower surface of the intermediate substrate 14 in the pressing step.

In the embodiment described above, copper is used as the high melting point metal contained in the conductive paste, but aluminum, silver, gold, a copper alloy, a Cu—Sn alloy, or the like may be used. The surface of the high melting point metal particles contained in the conductive paste may be coated with tin, a tin alloy, or the like. In the embodiment described above, the Sn—Bi alloy is used as the low melting point metal, but tin as a simple substance may be used.

The laminated substrate 10 of the embodiment described above has the three substrates. However, the technique disclosed in this specification may be applied to a laminated substrate of multiple layers having three or more layers.

The relationship between the constituent elements of the embodiment described above and the constituent elements of the disclosure will be described. The electronic component 42 of the embodiment can be regarded as an example of an electronic component of the disclosure. In this case, the upper substrate 12 of the embodiment is an example of a first substrate of the disclosure. The intermediate substrate of the embodiment is an example of a second substrate of the disclosure. The lower substrate of the embodiment is an example of a third substrate of the disclosure. The prepreg 20 of the embodiment is an example of a first adhesive layer of the disclosure, and is an example of a first adhesive sheet of the disclosure. The prepreg 22 of the embodiment is an example of a second adhesive layer of the disclosure, and is an example of a second adhesive sheet of the disclosure. The post 30 of the embodiment is an example of a first post of the disclosure. The post 32 of the embodiment is an example of a second post of the disclosure.

On the other hand, the electronic component 40 of the embodiment can be regarded as an example of the electronic component of the disclosure. In this case, the lower substrate 16 of the embodiment is an example of the first substrate of the disclosure. The intermediate substrate of the embodiment is an example of the second substrate of the disclosure. The upper substrate of the embodiment is an example of the third substrate of the disclosure. The prepreg 22 of the embodiment is an example of the first adhesive layer of the disclosure, and is an example of the first adhesive sheet of the disclosure. The prepreg 20 of the embodiment is an example of the second adhesive layer of the disclosure, and is an example of the second adhesive sheet of the disclosure. The post 32 of the embodiment is an example of the first post of the disclosure. The post 30 of the embodiment is an example of the second post of the disclosure.

While the embodiment has been described above in detail, the embodiment is merely an example and does not limit the scope of the claims. The technology in the claims includes various modifications, changes, and alterations of specific examples described above. The technical elements described in this specification or the drawings show technical utilization singly or in various combinations and are not limited to combinations described in the claims at the time of application. In addition, the technology illustrated in this specification or the drawings accomplishes a plurality of objects simultaneously, and has technical utilization by accomplishing one of the objects.

What is claimed is:

1. A method of manufacturing a laminated substrate, the method comprising:
   preparing a first adhesive sheet having a first through-hole;
   preparing a second adhesive sheet having a second through-hole and a third through-hole;
   preparing a second substrate having a fourth through-hole;
   forming a first post by applying a conductive paste, in which a high melting point metal and a low melting point metal are mixed, to a rear surface of a first substrate or a front surface of the second substrate and heating the applied conductive paste to enter a semi-sintered state;
   forming a second post by applying the conductive paste, in which the high melting point metal and the low melting point metal are mixed, to a rear surface of the second substrate or a front surface of a third substrate and heating the applied conductive paste to enter a semi-sintered state;
   fixing an electronic component to the front surface of the third substrate; and
   after the forming of the first post, the forming of the second post, and the fixing of the electronic component to the front surface of the third substrate, bonding the first substrate, the second substrate, and the third substrate by laminating the first substrate, the second substrate, and the third substrate in a state in which the first adhesive sheet is disposed between the rear surface of the first substrate and the front surface of the second substrate and the second adhesive sheet is disposed between the rear surface of the second substrate and the front surface of the third substrate, and pressing and heating the first substrate, the second substrate, and the third substrate in a lamination direction, wherein during the bonding, the first post is disposed in the first through-hole to electrically connect the first substrate to the second substrate by the first post, the second post is disposed in the second through-hole to electrically connect the second substrate to the third substrate by the second post, and the electronic component is disposed in the third through-hole and the fourth through-hole.

2. The method of manufacturing a laminated substrate according to claim 1, wherein the semi-sintered state is a state in which at least a portion of the low melting point metal remains unalloyed and a plurality of particles of the high melting point metal is connected by the low melting point metal.

* * * * *